(12) United States Patent
Ko

(10) Patent No.: US 9,276,150 B2
(45) Date of Patent: Mar. 1, 2016

(54) SHEET FOR A PHOTOVOLTAIC CELL

(75) Inventor: Min Jin Ko, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 13/555,914

(22) Filed: Jul. 23, 2012

(65) Prior Publication Data

US 2013/0014822 A1    Jan. 17, 2013

Related U.S. Application Data

(63) Continuation of application No. PCT/KR2011/000526, filed on Jan. 25, 2011.

(30) Foreign Application Priority Data

Jan. 25, 2010 (KR) .................. 10-2010-0006696
Jan. 25, 2011 (KR) .................. 10-2011-0007451

(51) Int. Cl.
| | | |
|---|---|---|
| C08L 83/04 | (2006.01) | |
| H01L 31/048 | (2014.01) | |
| B32B 17/10 | (2006.01) | |
| H01L 31/049 | (2014.01) | |

(52) U.S. Cl.
CPC ...... *H01L 31/0481* (2013.01); *B32B 17/10018* (2013.01); *B32B 17/10798* (2013.01); *H01L 31/049* (2014.12); *Y02E 10/50* (2013.01); *Y10T 428/3154* (2015.04); *Y10T 428/31663* (2015.04)

(58) Field of Classification Search
CPC ............... B32B 17/10018; H01L 31/0481
USPC ....................................... 524/588
See application file for complete search history.

(56) References Cited

U.S. PATENT DOCUMENTS

| | | | |
|---|---|---|---|
| 6,844,568 | B2 | 1/2005 | Seki et al. |
| 2002/0021393 | A1* | 2/2002 | Ochiai et al. .................. 349/137 |
| 2008/0090986 | A1 | 4/2008 | Khanarian et al. |
| 2008/0099064 | A1 | 5/2008 | Hayes |
| 2009/0179180 | A1* | 7/2009 | Morita et al. ............. 252/501.1 |

FOREIGN PATENT DOCUMENTS

| | | |
|---|---|---|
| CN | 101165099 A | 4/2008 |
| CN | 101466795 A | 6/2009 |
| JP | 05-0335610 | 12/1993 |
| JP | 07-263722 | 10/1995 |
| JP | 2000-294818 A | 10/2000 |
| JP | 2004-063792 A | 2/2004 |
| JP | 2006-270025 A | 10/2006 |
| JP | 2007-070603 A | 3/2007 |
| JP | 2008-001828 A | 1/2008 |
| JP | 2009-545872 A | 12/2009 |
| KR | 10-2009-0131274 A | 12/2009 |
| WO | 2007148812 A1 | 12/2007 |
| WO | 2009007786 A2 | 1/2009 |

OTHER PUBLICATIONS

International Search Report issued in International Appln. No. PCT/KR2011/000526, dated Oct. 28, 2011, 2 pages.
Office Action issued by the State Intellectual Property Office of China in corresponding Application No. 201180007118.1, dated Jul. 22, 2014, 16 pgs.

* cited by examiner

*Primary Examiner* — Kuo-Liang Peng
(74) *Attorney, Agent, or Firm* — Rothwell, Figg, Ernst & Manbeck, P.C.

(57) ABSTRACT

A sheet for a photovoltaic cell is provided. The sheet for a photovoltaic cell has excellent heat resistance, lightfastness, weather resistance, moisture resistance and insulating properties, and may improve light condensing efficiency when applied to a photovoltaic module.

14 Claims, 2 Drawing Sheets

SHEET FOR A PHOTOVOLTAIC CELL

CROSS-REFERENCE TO RELATED APPLICATIONS

The present application is a continuation application of International Application PCT/KR2011/000526, with an international filing date of Jan. 25, 2011, which claims priority to and the benefit of Korean Patent Application No. 10-2010-0006696, filed Jan. 25, 2010, and of Korean Patent Application No. 10-2011-0007451, filed Jan. 25, 2011, the disclosures of which are incorporated herein by reference in their entireties.

TECHNICAL FIELD

The present invention relates to a sheet for a photovoltaic cell.

BACKGROUND ART

A photovoltaic cell which is also called a solar cell is a semiconductor device capable of converting light into electricity. If the photovoltaic cell is exposed to light, it generates a voltage, thereby inducing an electron flow. In this case, the magnitude of the electron flows is proportional to the collision strength of light on a photovoltaic cell junction formed on the cell surface.

Typical photovoltaic cells include a silicon wafer photovoltaic cell and a thin film photovoltaic cell. The silicon wafer photovoltaic cell uses a photoelectric transformation element which is prepared using a single crystal or polycrystalline silicone ingot, and a photoelectric transformation element used in the thin film photovoltaic cell is deposited on a substrate or a ferroelectric using a method such as sputtering or deposition.

Since both of the silicon wafer photovoltaic cells and the thin film photovoltaic cells are brittle, such photovoltaic cells require a support member having resistance to loads. The support member may be a light-transmissive top layer disposed on a photovoltaic cell, or a bottom layer disposed at a rear surface of the photovoltaic cell.

The bottom layer disposed at the rear surface of the photovoltaic cell is generally in the form of rigid back skin. Various materials which can be applied onto such a bottom layer are known, and examples of the materials include a ferroelectric such as glass; a metal foil such as aluminum foil; organic fluororesin; or a polyester polymer film on which the fluororesin or the metal foil is laminated.

A structure in which an organic fluororesin sheet is laminated on a polymer substrate such as poly (ethylene terephthalate) or a structure in which a coating layer is formed on the polymer substrate by coating the organic fluororesin is most frequently used. Such materials may be applied alone to a photovoltaic module or also may be applied after the materials are coated with a silicon or oxygen material such as $SiO_x$.

However, currently used fluororesin sheets have low mechanical strength as well as low adhesive strength to an encapsulant or polymer base of a photovoltaic module, and thus have problems with durability when used for a long period of time. Also, the fluororesin sheet has poor processability and is very expensive. Also, a polymer base coated with the fluororesin has poor adhesive strength to the polymer base since the fluororesin itself shows poor coatability.

Also, a technique of preparing a laminated sheet using a polyolefin has also been known in the art. However, such a polyolefin has insufficient properties such as heat resistance, lightfastness and weather resistance, and thus is not suitable for use as a bottom layer required to have long-term reliability.

DISCLOSURE

Technical Problem

An object of the present invention is to provide a sheet for a photovoltaic cell.

Technical Solution

The present invention relates to a sheet for a photovoltaic cell that includes a resin layer. The resin layer includes a silicone resin and a high refractive filler that has a refractive index of 1.55 or more with respect to light having a wavelength of 400 nm. In one embodiment, the sheet for a photovoltaic cell may be used as a back sheet of a photovoltaic module.

The sheet for a photovoltaic cell will be described in further detail.

The silicone resin included in the resin layer shows excellent adhesive strength to various parts and materials, which are included in the photovoltaic module, such as an encapsulant, and also has excellent moisture resistance, weather resistance and lightfastness. In particular, the silicone resin may significantly improve light condensing efficiency of the photovoltaic module.

The silicone resin may preferably be a silicone resin that includes an aryl group, particularly an aryl group bound to a silicon atom. Such a silicone resin may form a resin layer having excellent moisture resistance, weather resistance and adhesive strength, and also excellent light condensing efficiency. Specific examples of the aryl group bound to a silicon atom are not particularly limited, but a phenyl group is preferred.

In the above, the silicone resin may have a molar ratio (Ar/Si) of the aryl group (Ar) bound to a silicon atom with respect to the total silicon atoms (Si) in the silicone resin of greater than 0.3. The molar ratio (Ar/Si) may preferably be greater than 0.5, and more preferably 0.7 or more. If the molar ratio (Ar/Si) is adjusted to greater than 0.3, it is possible to maintain excellent moisture resistance, weather resistance and hardness of the resin layer, as well as enhance electricity generation efficiency of the photovoltaic module. The upper limit of the molar ratio (Ar/Si) is not limited, but, for example, may be 1.5 or less or 1.2 or less.

In one embodiment, the silicone resin may be represented by an average composition formula of Formula 1.

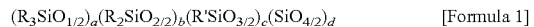

$$(R_3SiO_{1/2})_a(R_2SiO_{2/2})_b(R'SiO_{3/2})_c(SiO_{4/2})_d \quad \text{[Formula 1]}$$

wherein R', $R_2$ and $R_3$ are substituents directly bound to the silicon atoms, and independently represent hydrogen, a hydroxy group, an epoxy group, an acryloyl group, a methacryloyl group, an isocyanate group, an alkoxy group or a monovalent hydrocarbon group, with the provision that at least one of R', $R_2$ and $R_3$ represents an aryl group; a is between 0 and 0.6, b is between 0 and 0.95, c is between 0 and 0.8, and d is between 0 and 0.4, with the provision that a+b+c+d is 1, and b and c are not 0 simultaneously.

In this specification, a silicone resin being represented by a certain average composition formula means cases where the resin comprises a single resin component that is represented by the certain average composition formula as well as cases where the resin includes a mixture of at least two resin components, and an average composition of the at least two resin components is represented by the certain average composition formula.

In Formula 1, R', $R_2$ and $R_3$ are substituents directly bound to the silicon atoms, and the respective R', $R_2$ and $R_3$ may be the same or different, and independently represent hydrogen, a hydroxy group, an epoxy group, an acryloyl group, a methacryloyl group, an isocyanate group, an alkoxy group or a monovalent hydrocarbon group. In this case, R', $R_2$ and $R_3$ may be substituted with one or two or more substituents, if necessary.

In Formula 1, alkoxy may be linear, branched or cyclic alkoxy having 1 to 12 carbon atoms, preferably 1 to 8 carbon atoms, and more preferably 1 to 4 carbon atoms. Particularly, the alkoxy may include methoxy, ethoxy, propoxy, isopropoxy, butoxy, isobutoxy or tert-butoxy.

Also in Formula 1, examples of the monovalent hydrocarbon group may include an alkyl group, an alkenyl group, an aryl group or an arylalkyl group, and an alkyl group, an alkenyl group or an aryl group may be preferred.

In Formula 1, the alkyl group may be a linear, branched or cyclic alkyl group having 1 to 12 carbon atoms, preferably 1 to 8 carbon atoms, and more preferably 1 to 4 carbon atoms, and a methyl group may be preferred.

Also in Formula 1, the alkenyl group may be an alkenyl group having 2 to 12 carbon atoms, preferably 2 to 8 carbon atoms, and more preferably 2 to 4 carbon atoms, and a vinyl group may be preferred.

Also in Formula 1, the aryl group may be an aryl group having 6 to 18 carbon atoms, preferably 6 to 12 carbon atoms, and a phenyl group may be preferred.

Furthermore, in Formula 1, the arylalkyl group may be an arylalkyl group having 6 to 19 carbon atoms, preferably 6 to 13 carbon atoms, and a benzyl group may be preferred.

In Formula 1, at least one of R', $R_2$ and $R_3$ may be an aryl group, preferably a phenyl group, and the substituents may be included in the silicone resin to meet the above-mentioned molar ratio (Ar/Si).

Also in Formula 1, at least one of R', $R_2$ and $R_3$ may preferably be a hydroxy group, an epoxy group, an acryloyl group, a methacryloyl group or a vinyl group, and more preferably an epoxy group. Such a functional group may act to further improve adhesive strength of the encapsulant.

In Formula 1, a, b, c and d represent mole fractions of the siloxane units, respectively, and the total sum of a, b, c and d is 1. Also in Formula 1, a may be between 0 and 0.6, preferably between 0 and 0.5, b may be between 0 and 0.95, preferably between 0 and 0.8, c may be between 0 and 0.8, preferably between 0 and 0.7, and d is between 0 and 0.4, preferably between 0 and 0.2, with the provision that b and c are not 0 simultaneously.

In one embodiment, the silicone resin of Formula 1 may preferably include at least one siloxane unit that is selected from the group consisting of siloxane units represented by Formulas 2 and 3.

   [Formula 2]

   [Formula 3]

wherein $R^1$ and $R^2$ independently represent an alkyl group or an aryl group, with the provision that at least one of $R^1$ and $R^2$ represents an aryl group; and $R^3$ represents an aryl group.

In the above, the siloxane unit of Formula 2 may be a siloxane unit that includes at least one aryl group bound to a silicon atom. In this case, the aryl group may preferably be a phenyl group. Also, the alkyl group in the siloxane unit of Formula 2 may preferably be a methyl group.

In one embodiment, the siloxane unit of Formula 2 may be at least one unit selected from the group consisting of siloxane units of Formulas 4 and 5.

   [Formula 4]

   [Formula 5]

Also, the siloxane unit of Formula 3 may be a trifunctional siloxane unit that includes an aryl group bound to a silicon atom, and preferably be a siloxane unit represented by the Formula 6.

   [Formula 6]

In the silicone resin, the aryl groups bound to a silicon atom in the silicone resin may be preferably included in the siloxane unit of Formula 2 or 3. In this case, the siloxane unit of Formula 2 is preferably the siloxane unit of Formula 4 or 5, and the siloxane unit of Formula 3 is preferably the siloxane unit of Formula 6.

In one embodiment, the silicone resin may have a molecular weight of 300 to 100,000, preferably 500 to 100,000. If the molecular weight of the resin is adjusted to the above range, the sheet may have excellent hardness and may also show excellent processability. In the present invention, unless stated herein otherwise, the term "molecular weight" refers to a weight average molecular weight ($M_w$). Also, a weight average molecular weight refers to a value converted with respect to standard polystyrene and may be measured by gel permeation chromatography (GPC).

In one embodiment, the silicone resin may be any one of silicone resins represented by the Formulas 7 to 20, but not limited thereto.

   [Formula 7]

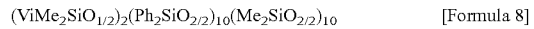   [Formula 8]

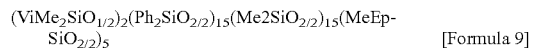   [Formula 9]

   [Formula 10]

   [Formula 11]

   [Formula 12]

   [Formula 13]

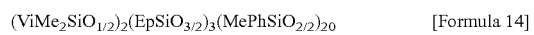   [Formula 14]

   [Formula 15]

   [Formula 16]

   [Formula 17]

   [Formula 18]

   [Formula 19]

   [Formula 20]

In Formulas 7 to 20, "Me" represents a methyl group, "Ph" represents a phenyl group, "Ac" represents an acryloyl group, and "Ep" represents an epoxy group.

The resin layer further includes the high refractive filler along with the silicone resin. The term "high refractive filler" may refer to a particle that has a refractive index of 1.55 or more with respect to light having a wavelength of 400 nm. As above, the resin layer includes the high refractive filler, and therefore the light condensing efficiency of the resin layer may be further improved.

Kinds of the high refractive fillers are not particularly limited as long as they show the above properties. Examples of the high refractive filler may include titanium oxide, zirconium oxide, cerium oxide, hafnium oxide, niobium pentoxide, tantalum pentoxide, indium oxide, tin oxide, indium tin oxide, zinc oxide, silicon, zinc sulfide, calcium carbonate, barium sulfate or magnesium oxide, which may be used alone or in combination thereof.

In one embodiment, the high refractive filler may have an average particle size of 40 nm to 100,000 nm, preferably 40 nm to 50,000 nm, and more preferably 200 nm to 10,000 nm. If the average particle size of the high refractive filler is adjusted to 40 nm or more, it is possible to homogeneously disperse the high refractive filler in the resin layer, whereas if the average particle size of the high refractive filler is adjusted to less than 100,000 nm, it is possible to maintain superior processability and adhesive strength.

The resin layer may include the high refractive filler in an amount of 0.1 parts by weight to 70 parts by weight, preferably 0.1 parts by weight to 50 parts by weight, relative to 100 parts by weight of the silicone resin. Throughout this specification, the unit "part(s) by weight" refers to a weight ratio(s). If the amounts of the high refractive filler are adjusted to 0.1 or more parts by weight, it is possible to improve reflection of incident light, whereas if the amounts of the high refractive filler are adjusted to less than 70 parts by weight, it is possible to effectively maintain processability and adhesive strength.

In one embodiment, the resin layer may optionally further include a component known in the art. Examples of such a component may include, but are not limited to, various thermoplastic resins; a flame retardant; a UV stabilizer; a UV absorbent; a glass fiber; a glass bead; an optical brightener, etc.

In one embodiment, the sheet for a photovoltaic cell may further include a base, and the resin layer may be formed on the base. In this case, the resin layer may be laminated on the base, or may be a coating layer that is formed by a coating method, and may preferably be a coating layer.

FIG. 1 is a schematic diagram showing an exemplary sheet (1) for a photovoltaic cell. As shown in FIG. 1, the sheet (1) for a photovoltaic cell may include a base (12) and a resin layer (11) formed on the base (12). In this case, kinds of the base are not particularly limited. For example, various metal foils such as an aluminum foil; a fluororesin film including vinyl fluoride (VF) or ethylene tetrafuloroethylene (ETFE) as a polymerizing unit; or a polyester film such as poly(ethylene terephthalate) (PET) may be used as the base, and a base in which at least two of the forgoing are laminated may also be used, if necessary. A thickness of the base is not particularly limited. A silicone oxide layer ($SiO_x$) or other primer layers or barrier layers may also be formed on the base in view of improvement of adhesive strength to the resin layer or a barrier property.

As shown in FIG. 2, the sheet may include the resin layer (11) formed on the base (12), and may further include a resin layer (23) formed on the other surface of the base (12). The resin layer (23) formed on the other surface of the base (12) may be the same resin layer as the resin layer (11), or a resin layer formed from different materials.

The present invention also relates to a method of preparing a sheet for a photovoltaic cell. The method includes forming a resin layer by coating a liquid coating solution, and then curing or drying the coated material. The liquid coating solution includes a silicone resin or a silicon material capable of forming the silicone resin and a high refractive filler that has a refractive index of 1.55 or more with respect to light having a wavelength of 400 nm.

In one embodiment, the sheet for a photovoltaic cell may be prepared by forming a resin layer by coating a liquid coating solution that includes the silicon resin as described above or a silicon material including a component capable of forming the silicon resin, and the high refractive filler on a base, and then curing or drying the material.

Kinds of the liquid silicon material which can form the silicone resin are not particularly limited, but may include various components known in the art, which may be used without any limitations. For example, the liquid silicon material may include an addition-curable silicone material, a condensation-curable or polycondensation-curable silicone material, a UV-curable silicone material or a peroxide-vulcanized silicone material, and an addition-curable silicone material, a condensation-curable or polycondensation-curable silicone material or a UV-curable silicone material may be preferred.

The addition-curable silicone material may be cured by hydrosilylation. This material includes at least an organic silicon compound having at least one hydrogen atom directly bound to a silicon atom and an organic silicon compound having at least one unsaturated aliphatic group such as a vinyl group. The organic silicon compounds react with each other to be cured in the presence of a catalyst. Examples of the catalyst may include metals of Group VIII in the Periodic Table; catalysts in which the metals are supported in a support such as alumina, silica or carbon black; or salts or complexes of the metals. The metals of Group VIII which may be used herein include platinum, rhodium or ruthenium, platinum being preferred.

A method using the condensation-curable or polycondensation-curable silicone material may include preparing a silicone resin by means of hydrolysis and condensation of a silicon compound or a hydrolysate thereof, such as silane or siloxane, which has a hydrolyzable functional group such as a halogen atom or an alkoxy group. A unit compound usable in this method may include a silane compound such as $R^a_3Si(OR^b)$, $R^a_2Si(OR^b)_2$, $R^aSi(OR^b)_3$ and $Si(OR^b)_4$. In the silane compound, ($OR^b$) may represent a linear or branched alkoxy group having 1 to 8 carbon atoms, and more particularly, may be methoxy, ethoxy, n-propoxy, n-butoxy, isopropoxy, isobutoxy, sec-butoxy or t-butoxy. Also in the silane compound, $R^a$ is a functional group bound to a silicon atom, and may be selected in consideration of substituents in a desired silicone resin.

A method using the UV-curable silicone material may include subjecting a silicon compound or a hydrolysate thereof, such as silane or siloxane having a UV-reactive group such as an acryloyl group, to hydrolysis and condensation to prepare a resin, and then preparing the desired resin by UV irradiation to the silicon resin.

The addition-curable, condensation-curable or polycondensation-curable, or UV-curable silicone materials are widely known in the art, and the liquid coating solution may be readily prepared using the known material by a person skilled in the art, according to a desired silicone resin.

In the above, a method of coating such a liquid coating solution is not particularly limited, but may be performed using a method such as bar coating, spin coating, comma coating, and the like. Also, a method of curing or drying the coated coating solution is not particularly limited, but may be performed using a suitable method such as heating or UV irradiation, in consideration of the components used.

The present invention also relates to a photovoltaic module that includes the sheet for a photovoltaic cell as described above; a front substrate; and an encapsulant that encapsulates a photoelectric transformation element between the sheet for a photovoltaic cell and the front substrate.

In the photovoltaic module, the sheet for a photovoltaic cell may be applied as a back sheet or a support substrate. As long as the photovoltaic module includes the sheet for a photovoltaic cell as described above, the module may be formed in various shapes without any limitations. Examples of the photovoltaic module may include a silicon wafer photovoltaic module or a thin film photovoltaic module.

FIGS. 3 and 4 are schematic diagrams showing a photovoltaic module according to various embodiments.

FIG. 3 shows one example of a photovoltaic module including the sheet for a photovoltaic cell, for example, a photovoltaic module (3) including a silicone photovoltaic cell wafer. As shown in FIG. 3, the photovoltaic module according to one exemplary embodiment may include a front substrate (31) typically made of a ferroelectric such as glass; a back sheet (34); a photoelectric transformation element (33) such as a silicone wafer; and encapsulants (32a and 32b) that encapsulate the photoelectric transformation element (33). An EVA material or silicone material, preferably a silicone material, may be used as the encapsulant. The sheet for a photovoltaic cell may be included as the back sheet (34).

FIG. 4 is a schematic diagram showing a thin film photovoltaic module (4) as a photovoltaic module according to another embodiment. As shown in FIG. 4, a photoelectric transformation element (43) may be formed at a front substrate (41) typically made of a ferroelectric, and the photoelectric transformation element (43) may be disposed between the front substrate (41) and the support substrate (44), and encapsulated by an encapsulant (42). The thin-film photoelectric transformation element (43) may be generally deposited using a method such as chemical vapor deposition (CVD), and the sheet for a photovoltaic cell may be, for example, included as the support substrate (44) in the module structure.

As long as the various photovoltaic modules as described above include at least the sheet for a photovoltaic cell, other configurations and production methods may be applied without any particular limitation, and general methods known in the art may be applied.

Advantageous Effects

The sheet for a photovoltaic cell, which has excellent properties such as heat resistance, lightfastness, weather resistance, moisture resistance, insulating properties and shows excellent light condensing efficiency when applied to a photovoltaic module, may be provided. Therefore, a photovoltaic module that has excellent electricity generation efficiency, shows superior durability, and maintains excellent electricity generation efficiency when used for a long period of time may be provided.

Figure 1:
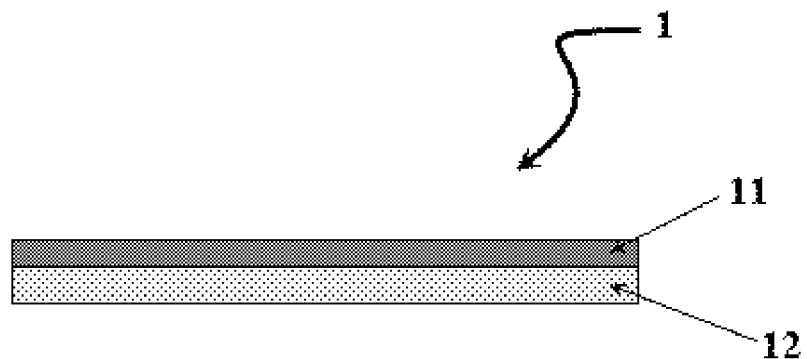
FIGS. 1 and 2 are diagrams showing various embodiments of a sheet for a photovoltaic cell.
Figure 2:
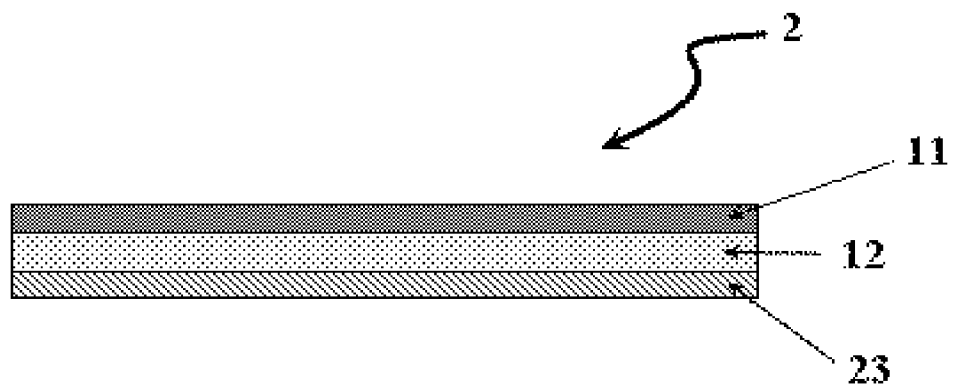
Figure 3:
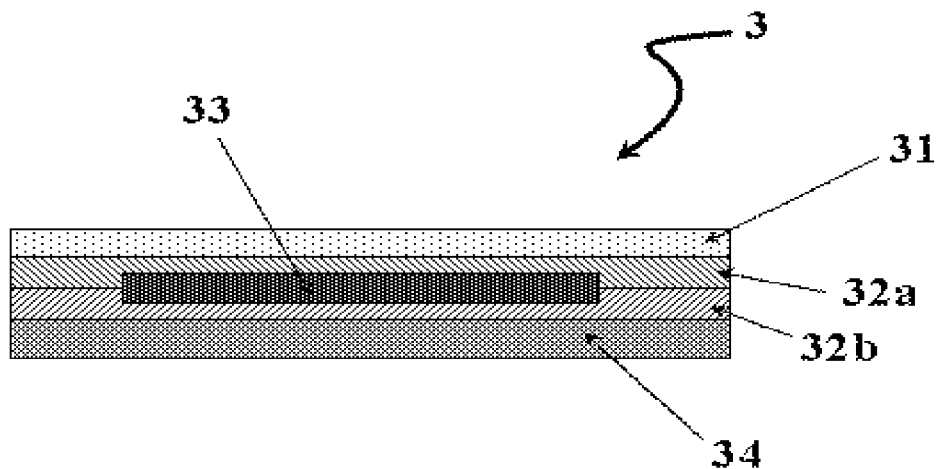
FIGS. 3 and 4 are diagrams showing various embodiments of a photovoltaic module to which the sheet for a photovoltaic cell is applied.
Figure 4:
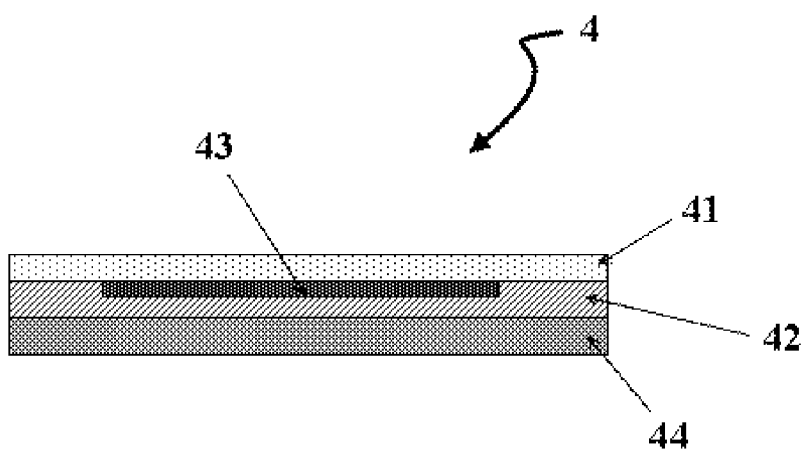

1, 2: sheets for a photovoltaic cell,
11: a resin layer,
12: a base,
23: a polymer coating layer,
3, 4: photovoltaic modules,
31, 41: front substrates,
32a, 32b, 42: encapsulant layers,
33, 43: photoelectric transformation elements,
34, 44: support substrates.

BEST MODE

Hereinafter, the present invention will be described in further detail referring to Examples according to the present invention and Comparative Examples that are not according to the present invention; however, the present invention is not limited to Examples.

In Examples, the symbol "Vi" represents a vinyl group, the symbol "Me" represents a methyl group, the symbol "Ph" represents a phenyl group, and the symbol "Ep" represents an epoxy group.

Example 1

Preparation of Resin Composition (A) and (B)

The organosiloxane compounds which were synthesized using a known method, and which were represented by the Formulas A, B, C and D were mixed together so as to prepare a siloxane composition capable of being cured by hydrosilylation (Mixing amounts: Compound A 100 g, Compound B 10 g, Compound C 200 g and Compound D 60 g). Then, a catalyst (platinum(0)-1,3-divinyl-1,1,3,3-tetramethyldisiloxane) was mixed at such an amount that the content of Pt(0) in the siloxane composition was 20 ppm, and homogeneously mixed to prepare resin composition (A). 50 g of a high refractive filler (TiO$_2$) having an average particle size of 100 nm and a refractive index of approximately 2.2 with respect to light having a wavelength of 400 nm was mixed with the resin composition (A) to prepare resin composition (B).

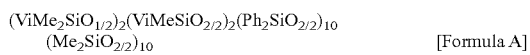
[Formula A]

[Formula B]

[Formula C]

[Formula D]

Preparation of Sheet for a Photovoltaic Cell

The resin composition (B) as prepared above was coated on both sides of a poly(ethylene terephthalate) (PET) sheet at such an amount that a thickness of the coated resin composition after a curing process was approximately 200 μm and cured to form a resin layer, thereby preparing a sheet for a photovoltaic cell. The curing process was performed by treating the coating layer at 150° C. for 1 hour.

Comparative Example 1

A sheet for a photovoltaic cell was prepared in the same manner as in Example 1, except that the resin composition (A) was used instead of the resin composition (B).

Comparative Example 2

Preparation of Resin Composition (C)

The organosiloxane compounds which were synthesized using a known method, and which were represented by the Formulas E to G were mixed together so as to prepare a siloxane composition capable of being cured by hydrosilylation (Mixing amounts: Compound E 100 g, Compound F 20 g and Compound G 50 g). Then, a catalyst (platinum(0)-1,3-divinyl-1,1,3,3-tetramethyldisiloxane) was mixed at such an amount that the content of Pt(0) in the siloxane composition was 10 ppm, and homogeneously mixed to prepare resin composition (C).

$$(ViMe_2SiO_{1/2})_2(ViMeSiO_{2/2})_{15}(MeSiO_{3/2})_5(Me_2SiO_{2/2})_{50} \quad \text{[Formula E]}$$

$$(ViMe_2SiO_{1/2})_3(MeSiO_{3/2})_6(PhSiO_{3/2})_{1.5} \quad \text{[Formula F]}$$

$$(HMe_2SiO_{1/2})_2(HMeSiO_{2/2})_2(Me_2SiO_{2/2})_{10} \quad \text{[Formula G]}$$

Preparation of Sheet for a Photovoltaic Cell

The resin composition (C) was coated on both sides of a PET sheet, and then cured to form resin layers having a thickness of 200 μm, thereby preparing a sheet for a photovoltaic cell. The curing process was performed by treating a coating layer at 150° C. for 1 hour.

Comparative Example 3

Preparation of Resin Composition (D)

The organosiloxane compounds which were synthesized using a known method, and which were represented by the Formulas H to J were mixed together so as to prepare a siloxane composition capable of being cured by hydrosilylation (Mixing amounts: Compound H 100 g, Compound I 20 g, and Compound J 50 g). Then, a catalyst (platinum(0)-1,3-divinyl-1,1,3,3-tetramethyldisiloxane) was mixed at such an amount that the content of Pt(0) in the siloxane composition was 20 ppm, and homogeneously mixed to prepare resin composition (D).

$$(ViPh_2SiO_{1/2})_2(Me_2SiO_{2/2})_{20} \quad \text{[Formula H]}$$

$$(ViPh_2SiO_{1/2})_3(MeSiO_{3/2})_{10} \quad \text{[Formula I]}$$

$$(HMe_2SiO_{1/2})_2(HMeSiO_{2/2})_2(Me_2SiO_{2/2})_{10} \quad \text{[Formula J]}$$

Preparation of Sheet for a Photovoltaic Cell

The resin composition (D) was coated on both sides of a PET sheet, and cured to form resin layers having a thickness of 200 μm, thereby preparing a sheet for a photovoltaic cell. The curing process was performed by treating a coating layer at 150° C. for 1 hour.

1. Evaluation of Power Generation of Photovoltaic Module

The sheets for a photovoltaic cell prepared in Example and Comparative Examples were used to prepare photovoltaic modules, as described later, and the prepared photovoltaic modules were evaluated for efficiency using a sum simulator. More particularly, glass substrates of the prepared photovoltaic modules were irradiated with a light source of approximately 1 kW for the same period of time, and the electricity generation capacities of the photovoltaic modules were measured. The measurement results are summarized and listed in the following Table 1.

<Preparation of Photovoltaic Module>

An interfaced photoelectric transformation element was placed on a front glass substrate on which an EVA encapsulant sheet was laminated, and then the same EVA encapsulant sheet as above was laminated again on the photoelectric transformation element. Then, each sheet for a photovoltaic cell prepared in Example and Comparative Examples was laminated on the EVA encapsulant sheet. Subsequently, the prepared laminate vacuum-heated at 150° C. for 30 minutes under reduced pressure to prepare a photovoltaic module.

TABLE 1

| | Example 1 | Comparative Example 1 | Comparative Example 2 | Comparative Example 3 |
|---|---|---|---|---|
| Power Generation Efficiency | 8.8% | 8.4% | 8.3% | 8.3% |

2. Moisture Permeability, Durability/Reliability and Yellowing Preventing Effect (1) Measurement of Moisture Permeability Composition (A) of Example 1, composition (C) of Comparative Example 2, and composition (D) of Comparative Example 3 were cured at 150° C. for 1 hour, respectively, to prepare 1 mm-thick planar test samples. Then, the prepared planar test samples were measured for moisture permeability. Moisture permeability of the planar test samples was measured in a thickness direction under the same conditions using a Mocon tester, and the results are listed in the following Table 2.

(2) Measurement of Reliability Under High-Temperature and High-Moisture Conditions Composition (A) of Example 1, composition (C) of Comparative Example 2, and composition (D) of Comparative Example 3 were coated to the same thickness on PET sheets, cured, and then kept at a temperature of 85° C. and a relative moisture of 85% for 1,000 hours. Then, the resulting cured products were evaluated according to the following evaluation criteria by examining whether peels appear between the resin layer and the PET sheet.

<Evaluation Criteria>

○: No peels appear in the interface between a resin layer and a PET sheet

×: Peels appear in the interface between a resin layer and a PET sheet (3) Measurement of Yellowing Level Each of the same test samples used to measure the moisture permeability was illuminated with light at 60° C. for 3 days using a Q-UVA (340 nm, 0.89 W/Cm²) tester, and evaluated for yellowing according to the following criteria. The results are described, as follows.

<Evaluation Criteria>

○: Absorbance of light of 450 nm wavelength is less than 5%

×: Absorbance of light of 450 nm wavelength is more than 5%

TABLE 2

| | Example 1 (Composition (A)) | Comparative Example 2 (Composition (C)) | Comparative Example 3 (Composition (D)) |
|---|---|---|---|
| Moisture Permeability | 15 g/cm²/day | 105 g/cm²/day | 120 g/cm²/day |
| Durability/Reliability | ○ | × | × |
| Yellowing | ○ | ○ | ○ |

The invention claimed is:

1. A sheet for a photovoltaic cell that comprises a resin layer, the resin layer comprising a silicone resin represented by an average composition formula of Formula 1 and a high refractive filler of which a refractive index with respect to light having a wavelength of 400 nm is 1.55 or more, $$(R_3SiO_{1/2})_a(R_2SiO_{2/2})_b(R'SiO_{3/2})_c(SiO_{4/2})_d \quad \text{[Formula 1]}$$

wherein the R and R' substituents are directly bound to a silicon atom, and independently represent hydrogen, a hydroxy group, an epoxy group, an acryloyl group, a methacryloyl group, an isocyanate group, an alkoxy group or a monovalent hydrocarbon group, with the provision that at least one of R and R' represent an aryl group; a is between 0 and 0.6, b is between 0 and 0.95, c is between 0 and 0.8, and d is between 0 and 0.4, with the provision that a+b+c+d is 1, and b and c are not 0 simultaneously, wherein the resin layer comprises the high refractive filler in an amount of 0.1 parts by weight to 70 parts by weight, relative to 100 parts by weight of the silicone resin, and wherein a molar ratio (Ar/Si) of the aryl group (Ar) bound to a silicon atom with respect to the total silicon atoms (Si) in the silicon resin is greater than 0.5.

2. The sheet for a photovoltaic cell of claim 1, wherein the aryl group in the silicone resin is a phenyl group.

3. The sheet for a photovoltaic cell of claim 1, wherein the at least one of the R and R' substituents is a hydroxy group, an epoxy group, an acryloyl group, a methacryloyl group or a vinyl group.

4. The sheet for a photovoltaic cell of claim 1, wherein the at least one of the R and R' substituents is an epoxy group.

5. The sheet for a photovoltaic cell of claim 1, wherein the silicone resin represented by the average composition formula of Formula 1 comprises a siloxane unit of Formula 2 or 3:

$$R^1R^2SiO_{2/2} \quad \text{[Formula 2]}$$

$$R^3SiO_{3/2} \quad \text{[Formula 3]}$$

wherein $R^1$ and $R^2$ independently represent an alkyl group or an aryl group, with the provision that at least one of $R^1$ and $R^2$ represents an aryl group; and $R^3$ represents an aryl group.

6. The sheet for a photovoltaic cell of claim 5, wherein all the aryl groups bound to a silicon atom in the silicone resin are included in the siloxane unit of Formula 2 or 3.

7. The sheet for a photovoltaic cell of claim 5, wherein the siloxane unit of Formula 2 is at least one selected from the group consisting of siloxane units of Formulas 4 and 5:

$$(C_6H_5)(CH_3)SiO_{2/2} \quad \text{[Formula 4]}$$

$$(C_6H_5)_2SiO_{2/2}. \quad \text{[Formula 5]}$$

8. The sheet for a photovoltaic cell of claim 5, wherein the siloxane unit of Formula 3 is a siloxane unit of Formula 6:

$$(C_6H_5)SiO_{3/2}. \quad \text{[Formula 6]}$$

9. The sheet for a photovoltaic cell of claim 1, wherein the silicone resin has a weight average molecular weight of 300 to 100,000.

10. The sheet for a photovoltaic cell of claim 1, wherein the sheet further comprises a base, and the resin layer is formed on the base.

11. The sheet for a photovoltaic cell of claim 10, wherein the base is a metal foil, a fluororesin film, a polyester film, or a sheet in which two or more of the foregoing are laminated.

12. The sheet for a photovoltaic cell of claim 1, wherein the high refractive filler has an average particle size of 40 nm to 100,000 nm.

13. A method of preparing a sheet for a photovoltaic cell that comprises forming a resin layer by coating a liquid coating solution that comprises a silicone resin represented by an average composition formula of Formula 1 or a silicone material capable of forming the silicone resin represented by an average composition formula of Formula 1 and a high refractive filler of which a refractive index with respect to light having a wavelength of 400 nm is 1.55 or more, and then curing or drying the coated solution:

$$(R_3SiO_{1/2})_a(R_2SiO_{2/2})_b(R'SiO_{3/2})_c(SiO_{4/2})_d \quad \text{[Formula 1]}$$

wherein the R and R' substituents are directly bound to a silicon atom, and independently represent hydrogen, a hydroxy group, an epoxy group, an acryloyl group, a methacryloyl group, an isocyanate group, an alkoxy group or a monovalent hydrocarbon group, with the provision that at least one of R and R' represent an aryl group; a is between 0 and 0.6, b is between 0 and 0.95, c is between 0 and 0.8, and d is between 0 and 0.4, with the provision that a+b+c+d is 1, and b and c are not 0 simultaneously, wherein the resin layer comprises the high refractive filler in an amount of 0.1 parts by weight to 70 parts by weight, relative to 100 parts by weight of the silicone resin, and wherein a molar ratio (Ar/Si) of the aryl group (Ar) bound to a silicon atom with respect to the total silicon atoms (Si) in the silicon resin is greater than 0.5.

14. A photovoltaic module that comprises the sheet for a photovoltaic cell defined in claim 1; a front substrate; and an encapsulant that encapsulates a photoelectric transformation element between the sheet for a photovoltaic cell and the front substrate.

* * * * *